US012720742B2

(12) United States Patent
Woo et al.

(10) Patent No.: US 12,720,742 B2
(45) Date of Patent: Aug. 25, 2026

(54) SEMICONDUCTOR DEVICE INCLUDING BIT LINE PAD, METHOD FOR MANUFACTURING THE SAME AND ELECTRONIC SYSTEM INCLUDING THE SAME

(71) Applicant: SAMSUNG ELECTRONICS CO., LTD., Suwon-si (KR)

(72) Inventors: Myunghun Woo, Hwaseong-si (KR); Jooheon Kang, Seoul (KR); Hyunmog Park, Seoul (KR); Jongho Woo, Hwaseong-si (KR); Suseong Noh, Suwon-si (KR); Youngji Noh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 729 days.

(21) Appl. No.: 18/096,257

(22) Filed: Jan. 12, 2023

(65) Prior Publication Data

US 2023/0269942 A1 Aug. 24, 2023

(30) Foreign Application Priority Data

Feb. 23, 2022 (KR) ........................ 10-2022-0023612

(51) Int. Cl.

*H10B 43/27* (2023.01)
*H10B 41/27* (2023.01)

(Continued)

(52) U.S. Cl.

CPC ............. *H10B 43/27* (2023.02); *H10B 41/27* (2023.02); *H10B 41/35* (2023.02); *H10B 41/49* (2023.02); *H10B 43/35* (2023.02); *H10B 43/40* (2023.02)

(58) Field of Classification Search

None

See application file for complete search history.

(56) References Cited

U.S. PATENT DOCUMENTS 8,427,878 B2 4/2013 Shim et al.
9,059,395 B2 6/2015 Ju et al.

(Continued)

FOREIGN PATENT DOCUMENTS

KR 10-2247029 B1 4/2021
KR 1020210100388 A 8/2021
KR 1020210107304 A 9/2021

OTHER PUBLICATIONS

Chao Sung Lai et al., “2005 Characterization of $CF_4$-plasma fluorinated $HfO_2$ gate dielectrics with TaN metal gate”, Appl. Phys. Lett. 86, 222905 (2005).

*Primary Examiner* — Sarah K Salerno
(74) *Attorney, Agent, or Firm* — Muir Patent Law, PLLC

(57) ABSTRACT

A semiconductor device includes a gate stack structure including alternately stacked insulating patterns and conductive patterns; a memory channel structure extending through the gate stack structure; and a bit line pad on the memory channel structure, wherein the memory channel structure includes a variable resistance layer, a channel layer surrounding the variable resistance layer, and a channel insulating layer surrounding the channel layer, and a bottom surface of the bit line pad contacts a top surface of the variable resistance layer, a top surface of the channel layer, and a top surface of the channel insulating layer.

20 Claims, 15 Drawing Sheets

(51) Int. Cl.

| | |
|---|---|
| ***H10B 41/35*** | (2023.01) |
| ***H10B 41/49*** | (2023.01) |
| ***H10B 43/35*** | (2023.01) |
| ***H10B 43/40*** | (2023.01) |

(56) References Cited

U.S. PATENT DOCUMENTS

| | | | | |
|---|---|---|---|---|
| 9,859,207 | B2 | 1/2018 | Kim | |
| 2019/0035798 | A1* | 1/2019 | Hwang .................. | H10B 20/60 |
| 2020/0203430 | A1* | 6/2020 | Lee ........................ | H10N 70/24 |
| 2020/0274001 | A1 | 8/2020 | Kim et al. | |
| 2020/0343307 | A1* | 10/2020 | Lee ........................ | H10B 63/84 |
| 2020/0365612 | A1 | 11/2020 | Hu et al. | |
| 2021/0035641 | A1* | 2/2021 | Yoon ...................... | G11C 16/10 |
| 2022/0246679 | A1* | 8/2022 | Cho ....................... | H10N 70/24 |
| 2023/0017843 | A1* | 1/2023 | Han ....................... | H10B 63/34 |

* cited by examiner 2500
2210
2400
2100
2130
2003
3210
3220
2200
2300
2003a
2003b
2005
2001
2002
2004
2006
2000
I
I'

SEMICONDUCTOR DEVICE INCLUDING BIT LINE PAD, METHOD FOR MANUFACTURING THE SAME AND ELECTRONIC SYSTEM INCLUDING THE SAME

CROSS-REFERENCE TO THE RELATED APPLICATION

This application claims priority from Korean Patent Application No. 10-2022-0023612, filed on Feb. 23, 2022, in the Korean Intellectual Property Office, the disclosure of which is incorporated herein by reference in its entirety.

BACKGROUND

1. Field

Embodiments relate to a semiconductor device including a bit line pad, a method for manufacturing the same, and an electronic system including the same.

2. Description of the Related Art

In an electronic system for storage of data, a semiconductor device capable of storing large volumes of data may be used. Accordingly, a scheme capable of increasing the data storage capacity of a semiconductor device has been considered.

SUMMARY

The embodiments may be realized by providing a semiconductor device including a gate stack structure including alternately stacked insulating patterns and conductive patterns; a memory channel structure extending through the gate stack structure; and a bit line pad on the memory channel structure, wherein the memory channel structure includes a variable resistance layer, a channel layer surrounding the variable resistance layer, and a channel insulating layer surrounding the channel layer, and a bottom surface of the bit line pad contacts a top surface of the variable resistance layer, a top surface of the channel layer, and a top surface of the channel insulating layer.

The embodiments may be realized by providing a semiconductor device including a gate stack structure including alternately stacked insulating patterns and conductive patterns; a memory channel structure extending through the gate stack structure; and a bit line pad on the memory channel structure, wherein the memory channel structure includes a variable resistance layer, a channel layer surrounding the variable resistance layer, and a channel insulating layer surrounding the channel layer, the insulating patterns include an uppermost insulating pattern at an uppermost portion of the gate stack structure, and the channel insulating layer has a first surface coplanar with a top surface of the uppermost insulating pattern, and a second surface coplanar with a side wall of the bit line pad.

The embodiments may be realized by providing an electronic system including a main substrate; a semiconductor device on the main substrate; and a controller electrically connected to the semiconductor device on the main substrate, wherein the semiconductor device includes a gate stack structure including alternately stacked insulating patterns and conductive patterns; a memory channel structure extending through the gate stack structure; and a bit line pad on the memory channel structure, the memory channel structure includes a variable resistance layer, a channel layer surrounding the variable resistance layer, and a channel insulating layer surrounding the channel layer, the insulating patterns include an uppermost insulating pattern at an uppermost portion of the gate stack structure, and a level of a top surface of the variable resistance layer, a level of a top surface of the channel layer, and a level of a top surface of the channel insulating layer are each higher than a level of a top surface of the uppermost insulating pattern.

The embodiments may be realized by providing a method for manufacturing a semiconductor device, the method including forming a gate stack structure that includes alternately stacked insulating patterns and sacrificial patterns; forming a memory channel structure surrounded by the gate stack structure; forming a pad material layer such that the pad material layer is at a higher level than a top surface of the gate stack structure and a top surface of the memory channel structure; patterning the pad material layer to form a bit line pad; and substituting the sacrificial patterns by conductive patterns.

BRIEF DESCRIPTION OF THE DRAWINGS

Features will be apparent to those of skill in the art by describing in detail exemplary embodiments with reference to the attached drawings in which:

FIGS. 3 and 4 are cross-sectional views schematically showing semiconductor packages according to some exemplary embodiments of the disclosure.

DETAILED DESCRIPTION

Figure 1:
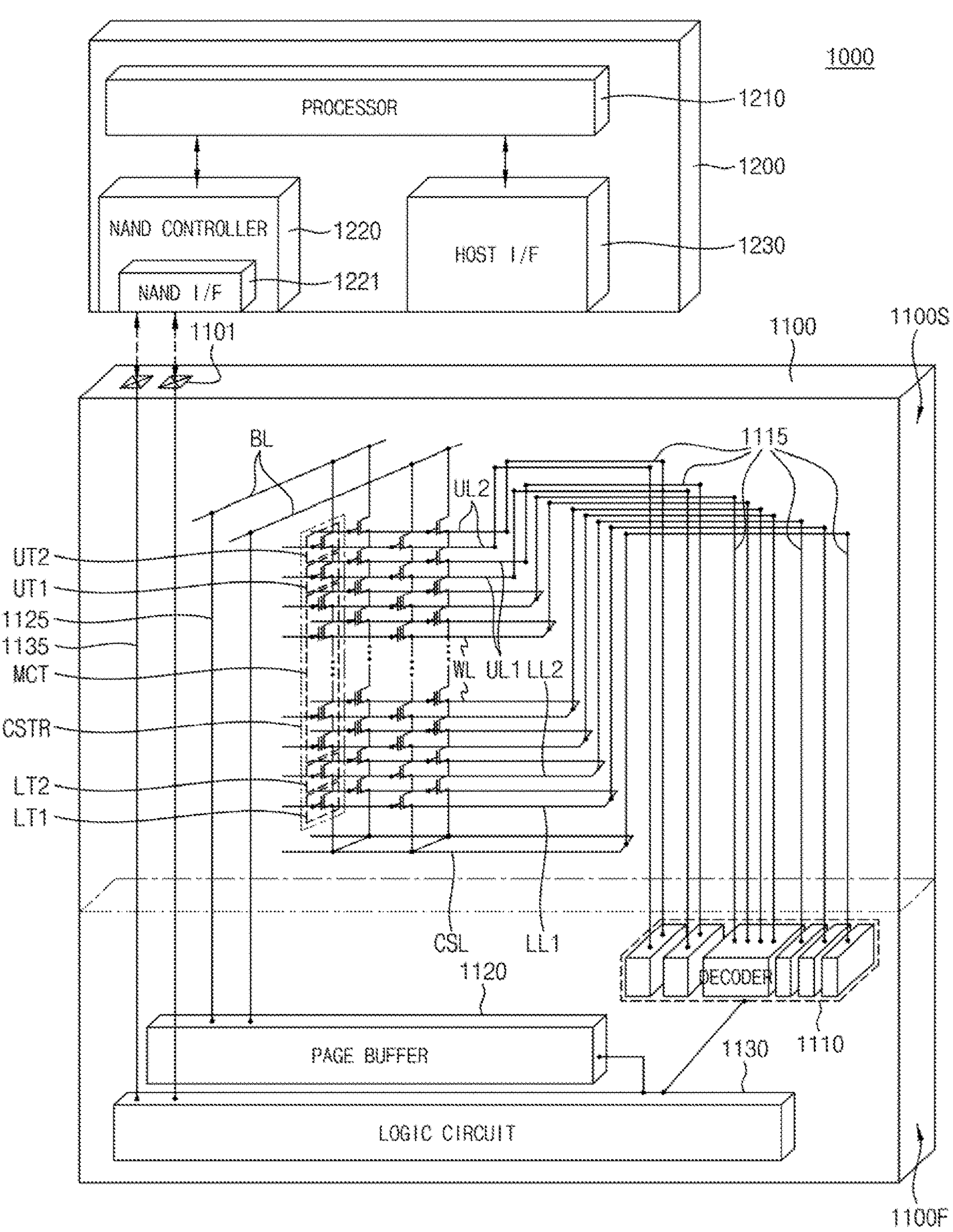
FIG. 1 is a view schematically showing an electronic system including a semiconductor device according to some exemplary embodiments of the disclosure.

FIG. 1 is a view schematically showing an electronic system including a semiconductor device according to some exemplary embodiments of the disclosure.

Referring to FIG. 1, an electronic system 1000 according to some exemplary embodiments of the disclosure may include a semiconductor device 1100, and a controller 1200 electrically connected to the semiconductor device 1100. The electronic system 1000 may be a storage device including one semiconductor device 1100 or a plurality of semiconductor devices 1100, or an electronic device including a storage device. In an implementation, the electronic system 1000 may be a solid state drive (SSD) device, a universal serial bus (USB) thumb drive, a computing system, a medical device, or a communication device that includes one semiconductor device 1100 or a plurality of semiconductor devices 1100.

The semiconductor device 1100 may be a non-volatile memory device. In an implementation, the semiconductor device 1100 may be a NAND flash memory device which will be described later with reference to FIGS. 5A and 5B. The semiconductor device 1100 may include a first structure 1100F, and a second structure 1100S on the first structure 1100F. In an implementation, the first structure 1100F may be at one side of the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of lower transistors LT1 and LT2 and the number of upper transistors UT1 and UT2 may be diversely varied in accordance with embodiments.

In an implementation, the upper transistors UT1 and UT2 may include a string selection transistor, and the lower transistors LT1 and LT2 may include a ground selection transistor. The gate lower lines LL1 and LL2 may be gate electrodes of the lower transistors LT1 and LT2, respectively. The word lines WL may be gate electrodes of the memory cell transistors MCT, respectively. The gate upper lines UL1 and UL2 may be gate electrodes of the upper transistors UT1 and UT2, respectively.

The common source line CSL, the first and second gate lower lines LL1 and LL2, the word lines WL, and the first and second gate upper lines UL1 and UL2 may be electrically connected to the decoder circuit 1110 via first connecting wirings 1115 extending from an inside of the first structure 1100F to the second structure 1100S. The bit lines BL may be electrically connected to the page buffer 1120 via second connecting lines 1125 extending from the inside of the first structure 1100F to the second structure 1100S.

In the first structure 1100F, the decoder circuit 1110 and the page buffer 1120 may perform a control operation for a selection memory cell transistor of at least one of the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 via an input/output connecting wiring 1135 extending from the inside of the first structure 1100F to the second structure 1100S.

The controller 1200 may include a processor 1210, a NAND controller 1220, and a host interface 1230. In an implementation, the electronic system 1000 may include a plurality of semiconductor devices 1100. In this case, the controller 1200 may control the plurality of semiconductor devices 1100.

The processor 1210 may control overall operations of the electronic system 1000 including the controller 1200. The processor 1210 may operate in accordance with predetermined firmware, and may access the semiconductor device 1100 by controlling the NAND controller 1220. The NAND controller 1220 may include a NAND interface 1221 for processing communication with the semiconductor device 1100. A control command for controlling the semiconductor device 1100, data to be written in the memory cell transistors MCT of the semiconductor device 1100, data to be read out from the memory cell transistors MCT of the semiconductor device 1100, or the like may be transmitted through the NAND interface 1221. The host interface 1230 may provide a communication function between the electronic system 1000 and an external host. Upon receiving a control command from an external host via the host interface 1230, the processor 1210 may control the semiconductor device 1100 in response to the control command.

Figure 2:
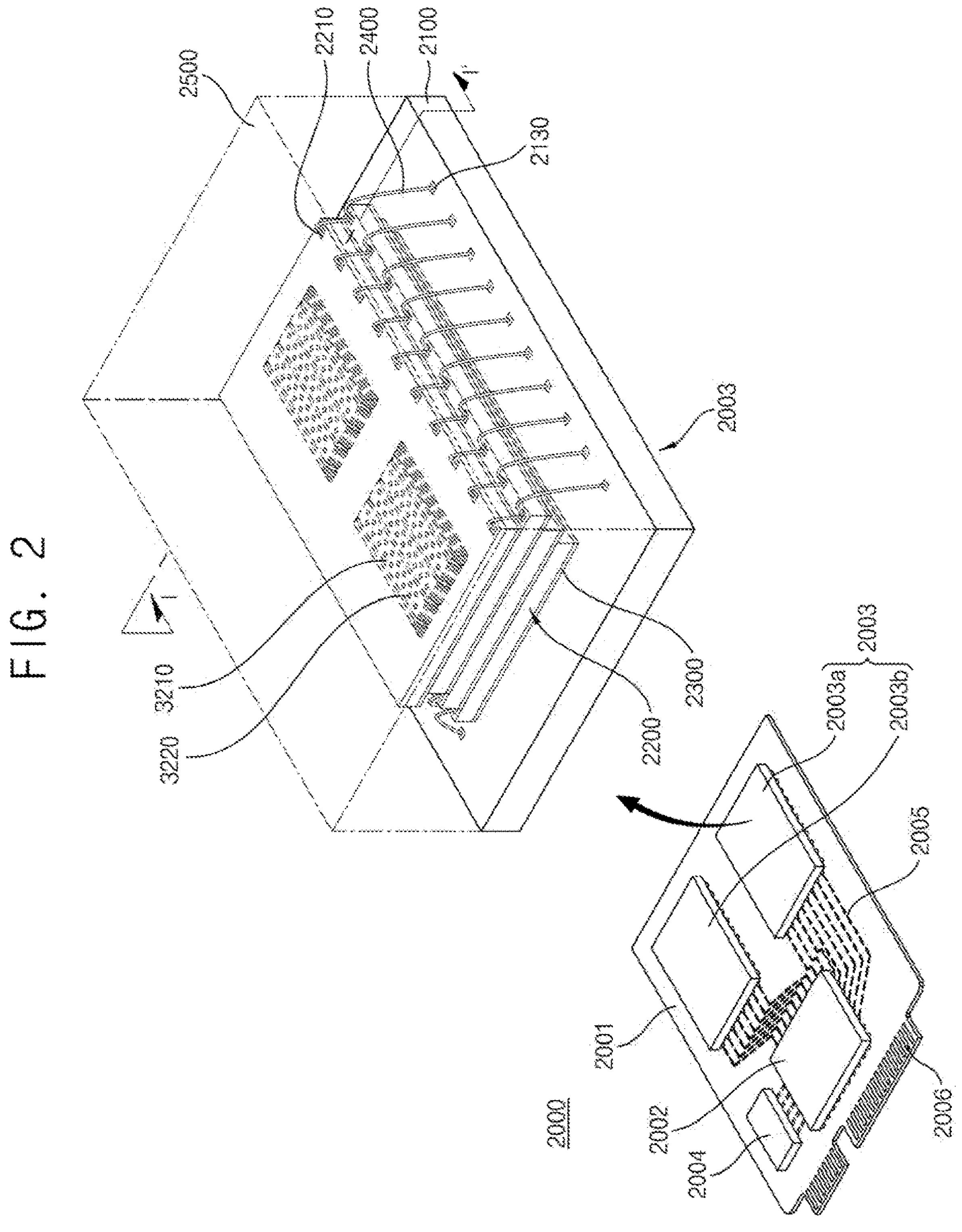
FIG. 2 is a perspective view schematically showing an electronic system including a semiconductor device according to some exemplary embodiments of the disclosure.

FIG. 2 is a perspective view schematically showing an electronic system including a semiconductor device according to some exemplary embodiments of the disclosure.

Referring to FIG. 2, an electronic system 2000 according to some exemplary embodiments of the disclosure may include a main substrate 2001, a controller 2002 mounted on the main substrate 2001, at least one semiconductor package 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins coupled to an external host. The number and arrangement of the plurality of pins in the connector 2006 may be varied in accordance with a communication interface between the electronic system 2000 and the external host. In an implementation, the electronic system 2000 may communicate with the external host in accordance with any one of interfaces such as a universal serial bus (USB), peripheral component interconnect express (PCI-Express), serial advanced technology attachment (SATA), M-PHY for universal flash storage (UFS), or the like. In an implementation, the electronic system 2000 may operate by power supplied from the external host via the connector 2006. The electronic system 2000 may further include a power management integrated circuit (PMIC) for distributing power supplied from the external host to the controller 2002 and the semiconductor package 2003.

The controller 2002 may write data in the semiconductor package 2003 or may read out data from the semiconductor package 2003. The controller 2002 may also enhance an operation speed of the electronic system 2000.

The DRAM 2004 may be a buffer memory for reducing a speed difference between the semiconductor package 2003, which is a data storage space, and the external host. The DRAM 2004, which is included in the electronic system 2000, may also operate as a kind of cache memory. The DRAM 2004 may also provide a space for temporarily storing data in a control operation for the semiconductor package 2003. When the DRAM 2004 is included in the electronic system 2000, the controller 2002 may further include a DRAM controller for controlling the DRAM 2004, in addition to the NAND controller for controlling the semiconductor package 2003.

The semiconductor package 2003 may include first and second semiconductor packages 2003*a* and 2003*b* spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, semiconductor chips 2200 on the package substrate 2100, bonding layers 2300 respectively at bottom surfaces of the semiconductor chips 2200, a connecting structure 2400 for electrically interconnecting the semiconductor chips 2200 and the package substrate 2100, and a molding layer 2500 covering the semiconductor chips 2200 and the connecting structure 2400 on the package substrate 2100.

The package substrate 2100 may be a printed circuit board including package upper pads 2130. Each of the semiconductor chips 2200 may include an input/output pad 2210. The input/output pad 2210 may correspond to the input/output pad 1101 of FIG. 1. Each of the semiconductor chips 2200 may include gate stack structures 3210 and memory channel structures 3220. Each of the semiconductor chips 2200 may include a semiconductor device which will be described later with reference to FIGS. 5A and 5B.

In an implementation, the connecting structure 2400 may be a bonding wire for electrically interconnecting the input/output pad 2210 and the package upper pads 2130. In an implementation, in each of the first and second semiconductor packages 2003*a* and 2003*b*, the semiconductor chips 2200 may be electrically interconnected through wire bonding, and may be electrically connected to the corresponding package upper pads 2130 of the package substrate 2100. In an implementation, in each of the first and second semiconductor packages 2003*a* and 2003*b*, the semiconductor chips 2200 may be electrically interconnected by a connecting structure including a through-silicon via (TSV) in place of the bonding wire type connecting structure 2400.

In an implementation, the controller 2002 and the semiconductor chips 2200 may be included in one package. In an implementation, the controller 2002 and the semiconductor chips 2200 may be mounted on a separate interposer substrate different from the main substrate 2001. In an implementation, the controller 2002 and the semiconductor chips 2200 may be interconnected by wirings formed at the interposer substrate.

Figure 3:
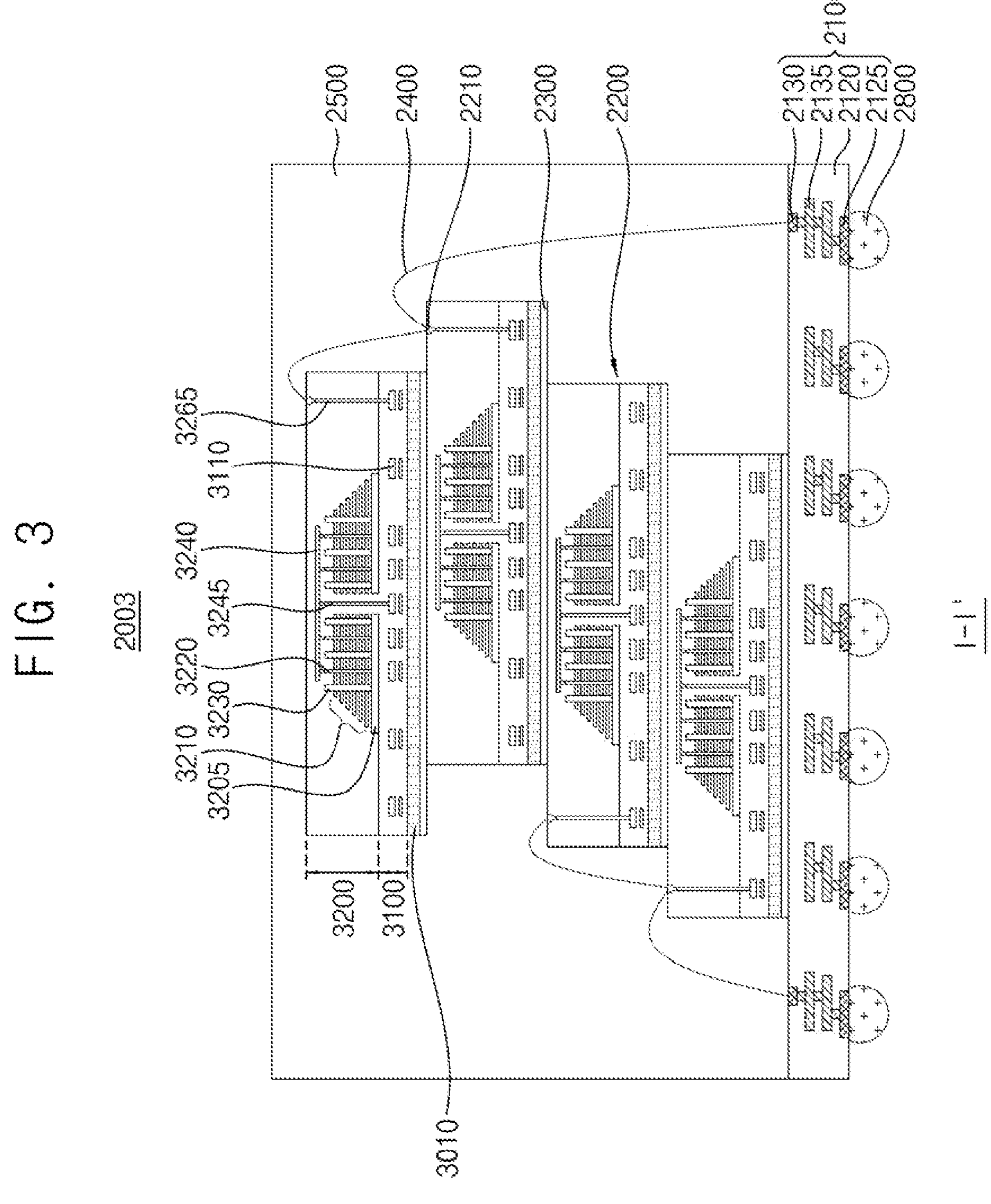
Figure 4:
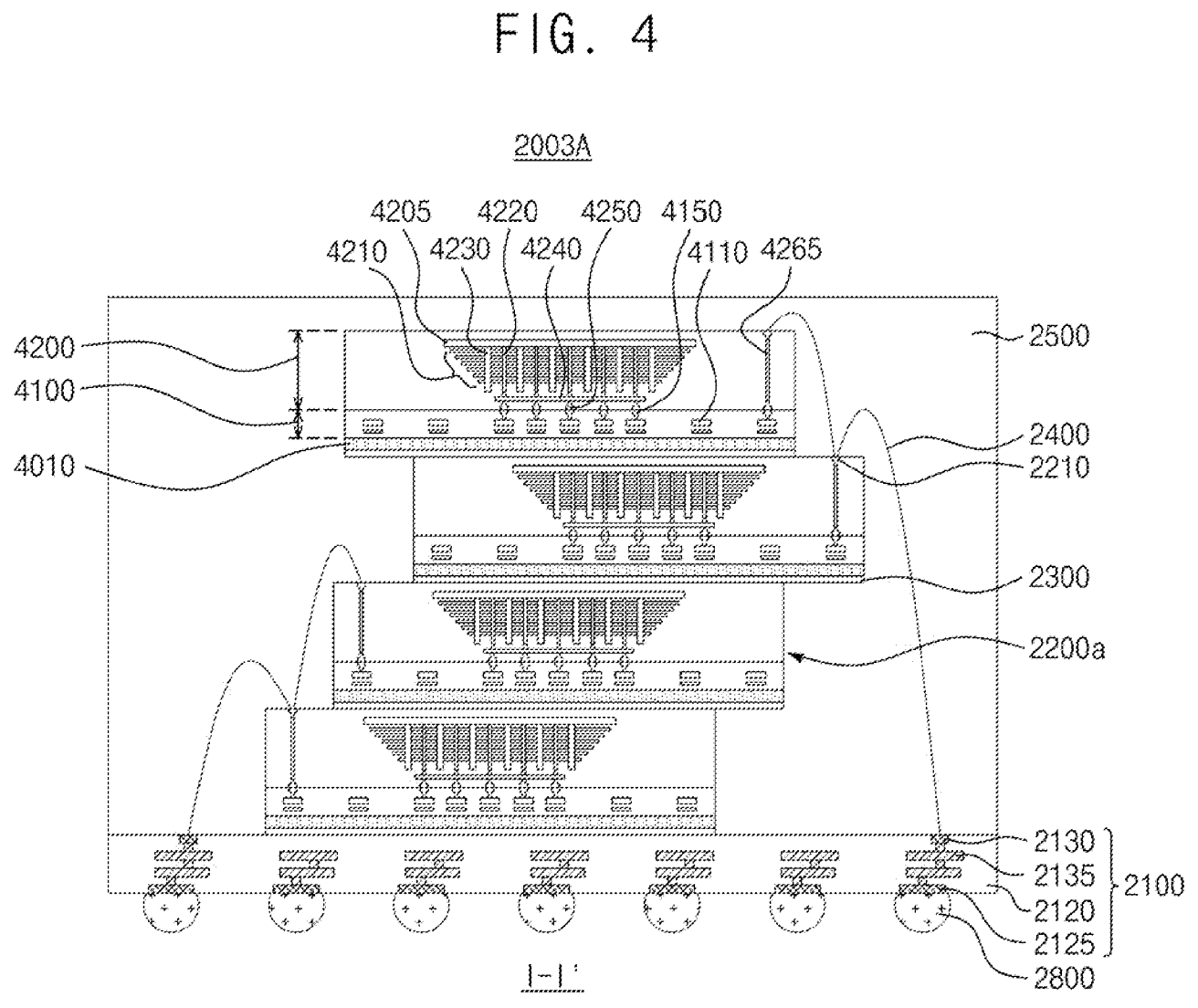

FIGS. 3 and 4 are cross-sectional views schematically showing semiconductor packages according to some exemplary embodiments of the disclosure. Each of FIGS. 3 and 4 explains an embodiment of the semiconductor package 2003 of FIG. 2, and conceptually shows an area of the semiconductor package 2003 taken along line I-I' in FIG. 2.

Referring to FIG. 3, in the semiconductor package 2003, the package substrate 2100 thereof may be a printed circuit board. The package substrate 2100 may include a package substrate body 2120, package upper pads 2130 at a top surface of the package substrate body 2120, lower pads 2125 at a bottom surface of the package substrate body 2120 or exposed through the bottom surface of the package substrate body 2120, and inner wirings 2135 electrically interconnecting the package upper pads 2130 and the lower pads 2125 within the package substrate body 2120. The package upper pads 2130 may be electrically connected to connecting structures 2400. The lower pads 2125 may be connected to the wiring patterns 2005 of the main substrate 2010 of the electronic system 2000 through conductive connectors 2800, as shown in FIG. 2.

Each of the semiconductor chips 2200 may include a semiconductor substrate 3010, and a first structure 3100 and a second structure 3200 sequentially stacked on the semiconductor substrate 3010. The first structure 3100 may include a peripheral circuit region including peripheral wirings 3110. The second structure 3200 may include a common source line 3205, a gate stack structure 3210 on the common source line 3205, memory channel structures 3220 and separation structures 3230 extending through the gate stack structure 3210, bit lines 3240 electrically connected to the memory channel structures 3220, and gate connecting wirings electrically connected to word lines ("WL" in FIG. 1) of the gate stack structure 3210.

Each of the semiconductor chips 2200 may include a through wiring 3245 electrically connected to the peripheral wirings 3110 of the first structure 3100 while extending into the second structure 3200. The through wiring 3245 may extend through the gate stack structure 3210, and may be further disposed outside the gate stack structure 3210. Each of the semiconductor chips 2200 may further include an input/output connecting wiring 3265 electrically connected to the peripheral wirings 3110 of the first structure 3100 while extending into the second structure 3200, and an input/output pad 2210 electrically connected to the input/output connecting wiring 3265.

Referring to FIG. 4, in a semiconductor package 2003A, each of semiconductor chips 2200*a* thereof may include a semiconductor substrate 4010, a first structure 4100 on the semiconductor substrate 4010, and a second structure 4200 bonded to the first structure 4100 on the first structure 4100 through wafer bonding.

The first structure 4100 may include a peripheral circuit region including a peripheral wiring 4110 and first bonding structures 4150. The second structure 4200 may include a common source line 4205, a gate stack structure 4210 between the common source line 4205 and the first structure 4100, memory channel structures 4220 and a separation structure 4230 extending through the gate stack structure 4210, and second bonding structures 4250 electrically connected to the memory channel structures 4220 and word lines of the gate stack structure 4210 ("WL" in FIG. 1), respectively. In an implementation, the second bonding structures 4250 may be electrically connected to the memory channel structures 4220 and the word lines ("WL" in FIG. 1) through bit lines 4240 electrically connected to the memory channel structures 4220 and gate connecting wirings electrically connected to the word lines ("WL" in FIG. 1), respectively. The first bonding structures 4150 of the first structure 4100 and the second bonding structures 4250 of the second structure 4200 may be bonded to each other while contacting each other. Bonding portions of the first bonding structures 4150 and the second bonding structures 4250 may be made of, e.g., copper (Cu).

Each of the semiconductor chips 2200*a* may further include an input/output pad 2210, and an input/output connecting wiring 4265 under the input/output pad 2210. The input/output connecting wiring 4265 may be electrically connected to a part of the second bonding structures 4250.

The semiconductor chips 2200 of FIG. 3 and the semiconductor chips 2200*a* of FIG. 4 may be electrically interconnected by bonding wire type connecting structures 2400. In an implementation, semiconductor chips in one semiconductor package such as the semiconductor chips 2200 of FIG. 3 and the semiconductor chips 2200*a* of FIG. 4 may be electrically interconnected by a connecting structure including a through-silicon via (TSV).

Figure 5A:
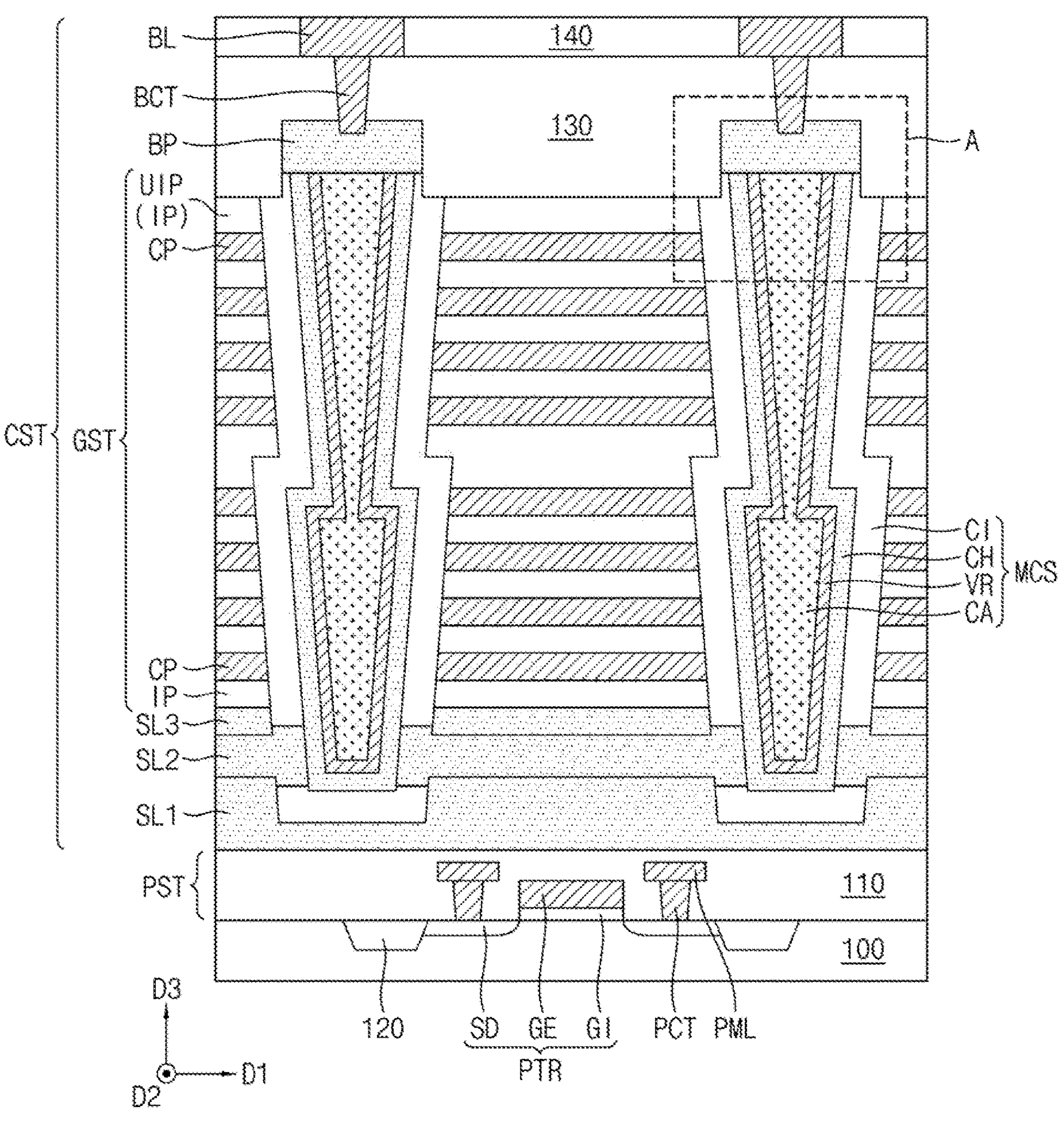
FIG. 5A is a cross-sectional view of a semiconductor device according to some exemplary embodiments of the disclosure.
Figure 5B:
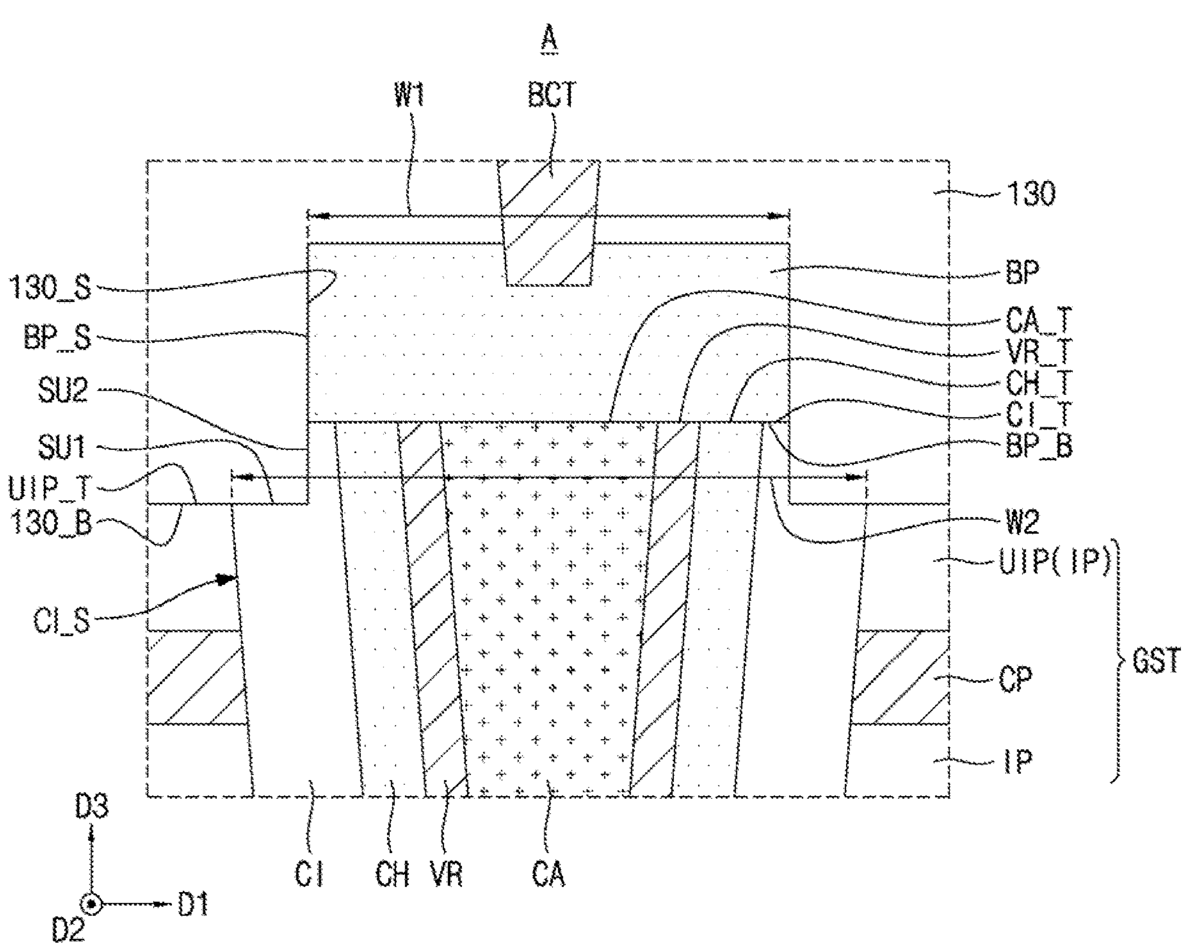
FIG. 5B is an enlarged view of a region A of FIG. 5A.

FIG. 5A is a cross-sectional view of a semiconductor device according to some exemplary embodiments of the disclosure. FIG. 5B is an enlarged view of a region A of FIG. 5A.

Referring to FIG. 5A, the semiconductor device according to the exemplary embodiments of the disclosure may include a substrate 100, a peripheral circuit structure PST on the substrate 100, and a memory cell structure CST on the peripheral circuit structure PST.

The substrate 100 may have the form of a plate extending along a plane defined by a first direction D1 and a second direction D2. The first direction D1 and the second direction D2 may intersect each other. In an implementation, the first direction D1 and the second direction D2 may be horizontal directions perpendicular to each other. In an implementation, the substrate 100 may be a semiconductor substrate. In an implementation, the substrate 100 may include silicon, germanium, silicon-germanium, GaP, or GaAs. In an implementation, the substrate 100 may be a silicon-on-insulator (SOI) substrate or a germanium-on-insulator (GOI) substrate. As used herein, the term "or" is not an exclusive term, e.g., "A or B" would include A, B, or A and B.

The peripheral circuit structure PST may include a peripheral circuit insulating layer 110 on the substrate 100. The peripheral circuit insulating layer 110 may include an insulating material. In an implementation, the peripheral circuit insulating layer 110 may include oxide. In an implementation, the peripheral circuit insulating layer 110 may be a multilayer insulating layer.

The peripheral circuit structure PST may further include a peripheral transistor PTR. The peripheral transistor PTR may be between the substrate 100 and the peripheral circuit insulating layer 110. The peripheral transistor PTR may include source/drain regions SD, a gate electrode GE, and a gate insulating layer GI. The gate electrode GE and the gate insulating layer GI may be between the source/drain regions SD. The gate electrode GE may be spaced apart from the substrate 100 by the gate insulating layer GI. The source/drain regions SD may be formed as the substrate 100 is doped with impurities. The gate electrode GE may include a conductive material. The gate insulating layer GI may include an insulating material.

Element isolation layers 120 may be in the substrate 100. The peripheral transistor PTR may be between the element isolation layers 120. The element isolation layer 120 may include an insulating material.

The peripheral circuit structure PST may further include peripheral contacts PCT and peripheral wirings PML. The peripheral contact PCT may be connected to the peripheral transistor PTR. The peripheral wiring PML may be connected to the peripheral contact PCT. The peripheral contact PCT and the peripheral wiring PML may be provided in the peripheral circuit insulating layer 110. The peripheral contact PCT and the peripheral wiring PML may include a conductive material.

The memory cell structure CST may include a first source layer SL1, a second source layer SL2, a third source layer SL3, a gate stack structure GST, memory channel structures MCS, a cover insulating layer 130, a bit line insulating layer 140, bit line pads BP, bit line contacts BCT, and bit lines BL.

The first source layer SL1 may be on the peripheral circuit insulating layer 110 of the peripheral circuit structure PST. The second source layer SL2 may be on the first source layer SL1. The third source layer SL3 may be on the second source layer SL2. The first to third source layers SL1, SL2 and SL3 may include a conductive material. In an implementation, the first to third source layers SL1, SL2 and SL3 may include polysilicon.

The gate stack structure GST may be on the third source layer LS3. The gate stack structure GST may include insulating patterns IP and conductive patterns CP alternately stacked in a third direction D3 (e.g., alternately stacked insulating patterns IP and conductive patterns CP). The third direction D3 may intersect the first direction D1 and the second direction D2. In an implementation, the third direction D3 may be a vertical direction perpendicularly intersecting the first direction D1 and the second direction D2.

The insulating patterns IP may include an uppermost insulating pattern UIP. The uppermost insulating pattern UIP may be an insulating pattern IP at an uppermost portion or end of the gate stack structure GST. The insulating patterns IP may include an insulating material. In an implementation, the insulating patterns IP may include oxide. The conductive patterns CP may include a conductive material. In an implementation, the conductive patterns CP may include tungsten.

The memory channel structures MCS may extend through the insulating patterns IP and the conductive patterns CP of the gate stack structure GST, the third source layer SL3 and the second source layer SL2 roughly in the third direction D3. The memory channel structures MCS may be surrounded by the insulating patterns IP and the conductive patterns CP of the gate stack structure GST. A lowermost portion of the memory channel structure MCS may be in the first source layer SL1.

Each of the memory channel structures MCS may include an insulating capping layer CA, a variable resistance layer VR surrounding the insulating capping layer CA, a channel layer CH surrounding the variable resistance layer VR, and a channel insulating layer CI surrounding the channel layer CH. The insulating capping layer CA, the variable resistance layer VR, the channel layer CH and the channel insulating layer CI may extend through the insulating patterns IP and the conductive patterns CP of the gate stack structure GST roughly in the third direction D3.

The variable resistance layer VR may include a material varying in resistance in accordance with an operation of the semiconductor device. In an implementation, the variable resistance layer VR may include a transition metal oxide. In an implementation, the transition metal may include, e.g., zirconium (Zr), hafnium (Hf), aluminum (Al), nickel (Ni), copper (Cu), molybdenum (Mo), tantalum (Ta), titanium (Ti), or tungsten (W). The semiconductor device may be a memory device configured to store data by utilizing a resistance variation of the variable resistance layer VR.

The insulating capping layer CA may include an insulating material. In an implementation, the insulating capping layer CA may include an insulating material that does not react with the variable resistance layer VR. In an implementation, the insulating material included in the insulating capping layer CA may not be chemically bonded to the material included in the variable resistance layer VR. In an implementation, the insulating capping layer CA may include silicon nitride.

The channel layer CH may include a conductive material. In an implementation, the channel layer CH may include polysilicon. The channel layer CH may be electrically connected to the second source layer SL2. The second source layer SL2 may be connected to the channel layer CH while extending through the channel insulating layer CI.

The channel insulating layer CI may include an insulating material. In an implementation, the channel insulating layer CI may include oxide. The channel insulating layer CI may be between the conductive patterns CP and the channel layer CH, thereby spacing the conductive patterns CP and the channel layer CH apart from each other.

The bit line pad BP may be on the memory channel structure MCS. The bit line pad BP may include a conductive material. In an implementation, the bit line pad BP may include polysilicon or metal.

The cover insulating layer 130 may cover the gate stack structure GST, the memory channel structures MCS, and the bit line pads BP. The cover insulating layer 130 may include an insulating material. The bit line contact BCT may be connected to the bit line pad BP while extending through the cover insulating layer 130. The bit line contact BCT may include a conductive material.

The bit line insulating layer 140 may cover the cover insulating layer 130 and the bit line contacts BCT. The bit line insulating layer 140 may include an insulating material. The bit line BL may be in the bit line insulating layer 140 and may be connected to the bit line contact BCT. The bit line BL may include a conductive material.

Referring to FIG. 5B, the channel insulating layer CI may include a first surface SU1 and a second surface SU2 between a top surface CI_T thereof and a side wall CI_S thereof. The side wall CI_S of the channel insulating layer CI may be inclined with respect to the third direction D3. The side wall CI_S of the channel insulating layer CI may contact (e.g., directly contact) the conductive patterns CP and the insulating patterns IP of the gate stack structure GST. The top surface CI_T of the channel insulating layer CI may contact (e.g., directly contact) the bit line pad BP.

The first surface SU1 of the channel insulating layer CI may be connected to the side wall CI_S of the channel insulating layer CI. The second surface SU2 of the channel insulating layer CI may be connected to the top surface CI_T of the channel insulating layer CI. The first and second surfaces SU1 and SU2 of the channel insulating layer CI may be interconnected. The first and second surfaces SU1 and SU2 of the channel insulating layer CI may intersect each other. In an implementation, the first and second surfaces SU1 and SU2 of the channel insulating layer CI may be a horizontal surface and a vertical surface perpendicularly intersecting each other. The first and second surfaces SU1 and SU2 of the channel insulating layer CI may interconnect the top surface CI_T and the side wall CI_S of the channel insulating layer CI.

The first surface SU1 of the channel insulating layer CI may be coplanar with a top surface UIP_T of the uppermost insulting pattern UIP. The second surface SU2 of the channel insulating layer CI may be coplanar, aligned, or continuous with a side wall BP_S of the bit line pad BP (e.g., as seen in a cross-sectional view). For example, when a surface (of a round or rounded structure) is described as being coplanar, the side surfaces of one element along its entire perimeter or circumference may be aligned with the side surfaces of an underlying element along its entire perimeter or circumference. The first surface SU1 of the channel insulating layer CI and the top surface UIP_T of the uppermost insulting pattern UIP may contact a bottom surface 130_B of the cover insulating layer 130. The second surface SU2 of the channel insulating layer CI and the side wall BP_S of the bit line pad BP may contact a side wall 130_S (e.g., inner side wall) of the cover insulating layer 130. A stepped structure may be defined at the channel insulating layer CI by the first and second surfaces SU1 and SU2 of the channel insulating layer CI.

The top surface CI_T of the channel insulating layer CI, a top surface CH_T of the channel layer CH, a top surface VR_T of the variable resistance layer VR, and a top surface CA_T of the insulating capping layer CA may be coplanar. The top surface CI_T of the channel insulating layer CI, the top surface CH_T of the channel layer CH, the top surface VR_T of the variable resistance layer VR, and the top surface CA_T of the insulating capping layer CA may contact (e.g., directly contact) a bottom surface BP_B of the bit line pad BP.

A level (e.g., distance from the substrate 100 in the third direction D3) of the top surface CI_T of the channel insulating layer CI, the top surface CH_T of the channel layer CH, the top surface VR_T of the variable resistance layer VR, and the top surface CA_T of the insulating capping layer CA may be higher (e.g., farther from the substrate 100 in the third direction D3) than the level of the top surface UIP_T of the uppermost insulating pattern UIP. The level of the top surface CI_T of the channel insulating layer CI, the top surface CH_T of the channel layer CH, the top surface VR_T of the variable resistance layer VR, and the top surface CA_T of the insulating capping layer CA may be higher than the level of the bottom surface 130_B of the cover insulating layer 130. The level of the bottom surface BP_B of the bit line pad BP may be higher than the level of the top surface UIP_T of the uppermost insulating pattern UIP. The level of the bottom surface BP_B of the bit line pad BP may be higher than the level of the bottom surface 130_B of the cover insulating layer 130. A maximum width W1 (e.g., in a horizontal direction D1 or D2) of the bit line pad BP may be smaller than a maximum width W2 of the memory channel structure MCS.

In the semiconductor device according to the exemplary embodiments of the disclosure, bit line pads BP may have a relatively small width and, as such, it may be possible to prevent a phenomenon in which the bit line pads BP are electrically interconnected.

FIGS. 6A, 6B, 6C, 6D, 6E and 6F are cross-sectional views showing stages in a semiconductor device manufacturing method according to some exemplary embodiments of the disclosure.

Figure 6A:
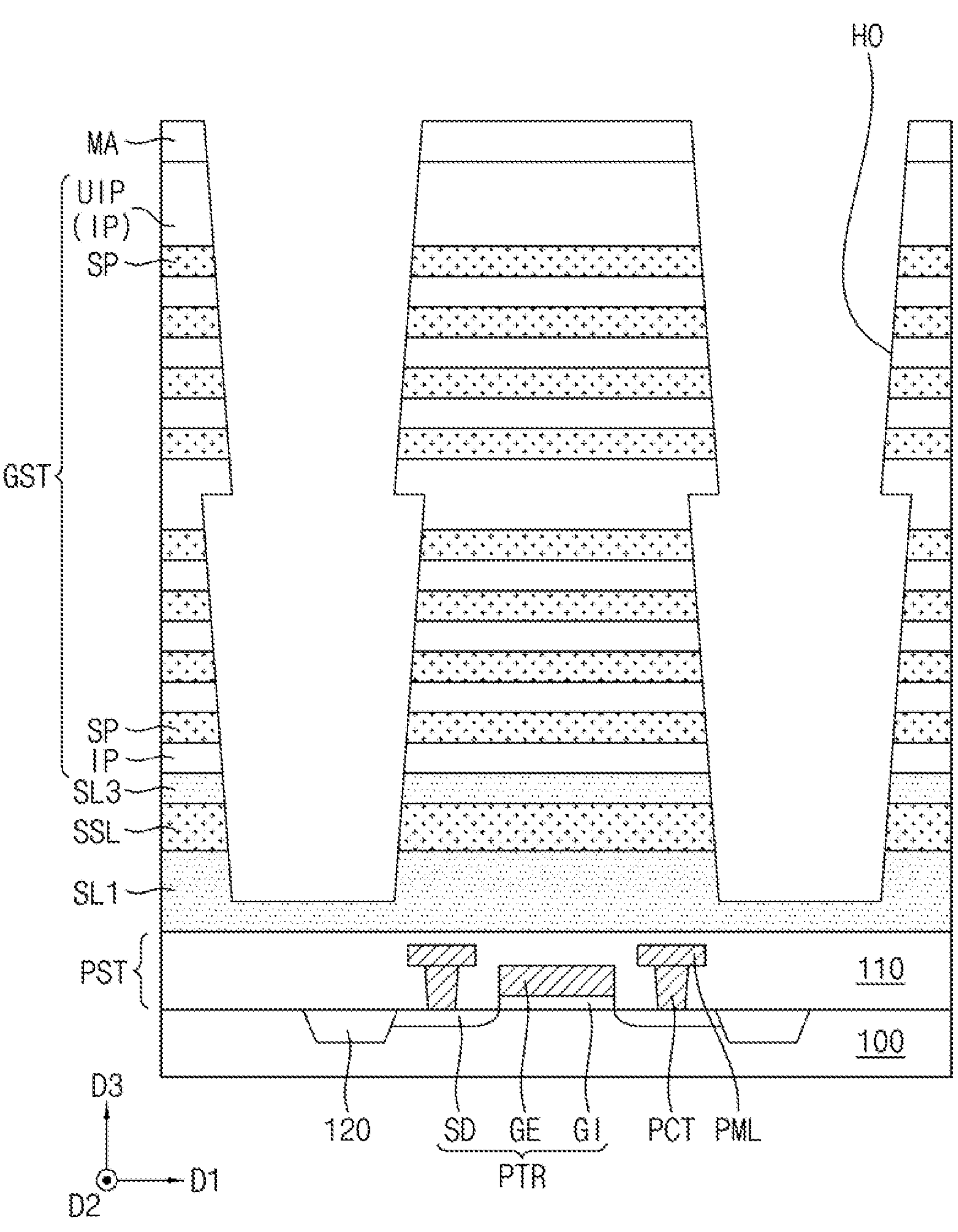
FIGS. 6A, 6B, 6C, 6D, 6E and 6F are cross-sectional views showing stages in a semiconductor device manufacturing method according to some exemplary embodiments of the disclosure.

Referring to FIG. 6A, a peripheral circuit structure PST may be formed on a substrate 100. Forming the peripheral circuit structure PST may include forming, on the substrate 100, a peripheral transistor PTR, peripheral contacts PCT, peripheral wirings PML and a peripheral circuit insulating layer 110. Element isolation layers 120 may be formed on the substrate 100.

A first source layer SL1, a source sacrificial layer SSL, and a third source layer SL3 may be formed on the peripheral circuit structure PST. The source sacrificial layer SSL may be formed on the first source layer SL1, and the third source layer SL3 may be formed on the source sacrificial layer SSL. The source sacrificial layer SSL may include an insulating material. In an implementation, the source sacrificial layer SSL may include nitride.

A gate stack structure GST may be formed on the third source layer SL3. The gate stack structure GST may include insulating patterns IP and sacrificial patterns SP that are alternately stacked. Forming the gate stack structure GST may include forming stack insulating layers and stack sacrificial layers which are alternately stacked, forming a mask layer MA, patterning the mask layer MA, and patterning the stack insulating layers and the stack sacrificial layers using the patterned mask layer MA as a mask, thereby forming insulating patterns IP and sacrificial patterns SP.

As the stack insulating layers and the stack sacrificial layers are patterned, channel holes HO may be formed. The channel holes HO may be surrounded by the insulating patterns IP and the sacrificial patterns SP of the gate stack structure GST. The channel holes HO may extend through the third source layer SL3 and the source sacrificial layer SSL. The mask layer MA may include an insulating material. In an implementation, the mask layer MA may include oxide.

Figure 6B:
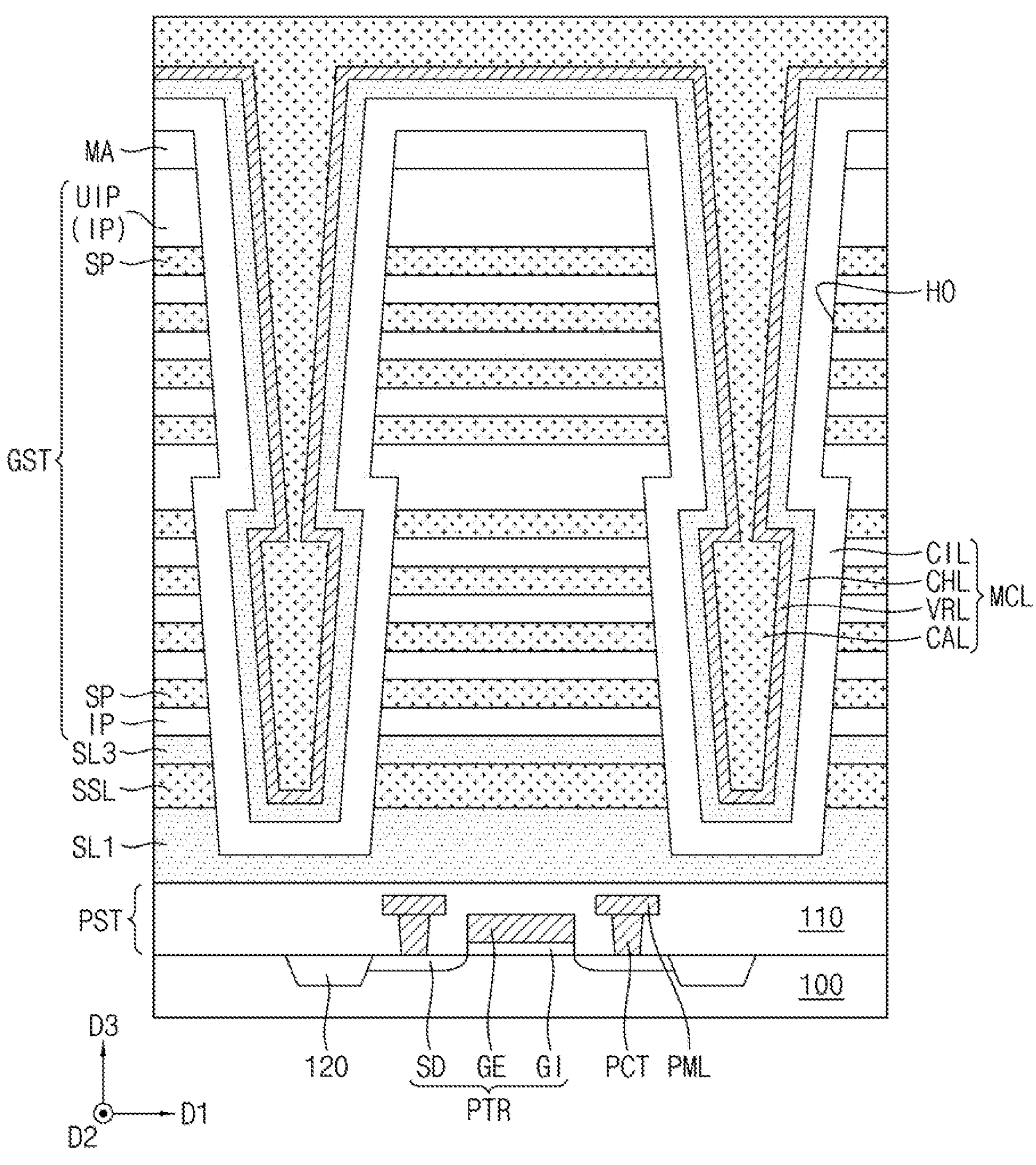

Referring to FIG. 6B, a memory channel material layer MCL may be formed. The memory channel material layer MCL may include a channel insulating material layer CIL, a channel material layer CHL, a variable resistance material layer VRL, and a capping material layer CAL. Forming the memory channel material layer MCL may include sequentially forming the channel insulating material layer CIL, the channel material layer CHL, the variable resistance material layer VRL, and the capping material layer CAL. The channel insulating material layer CIL, the channel material layer CHL, the variable resistance material layer VRL and the capping material layer CAL of the memory channel material layer MCL may fill the channel holes HO.

Figure 6C:
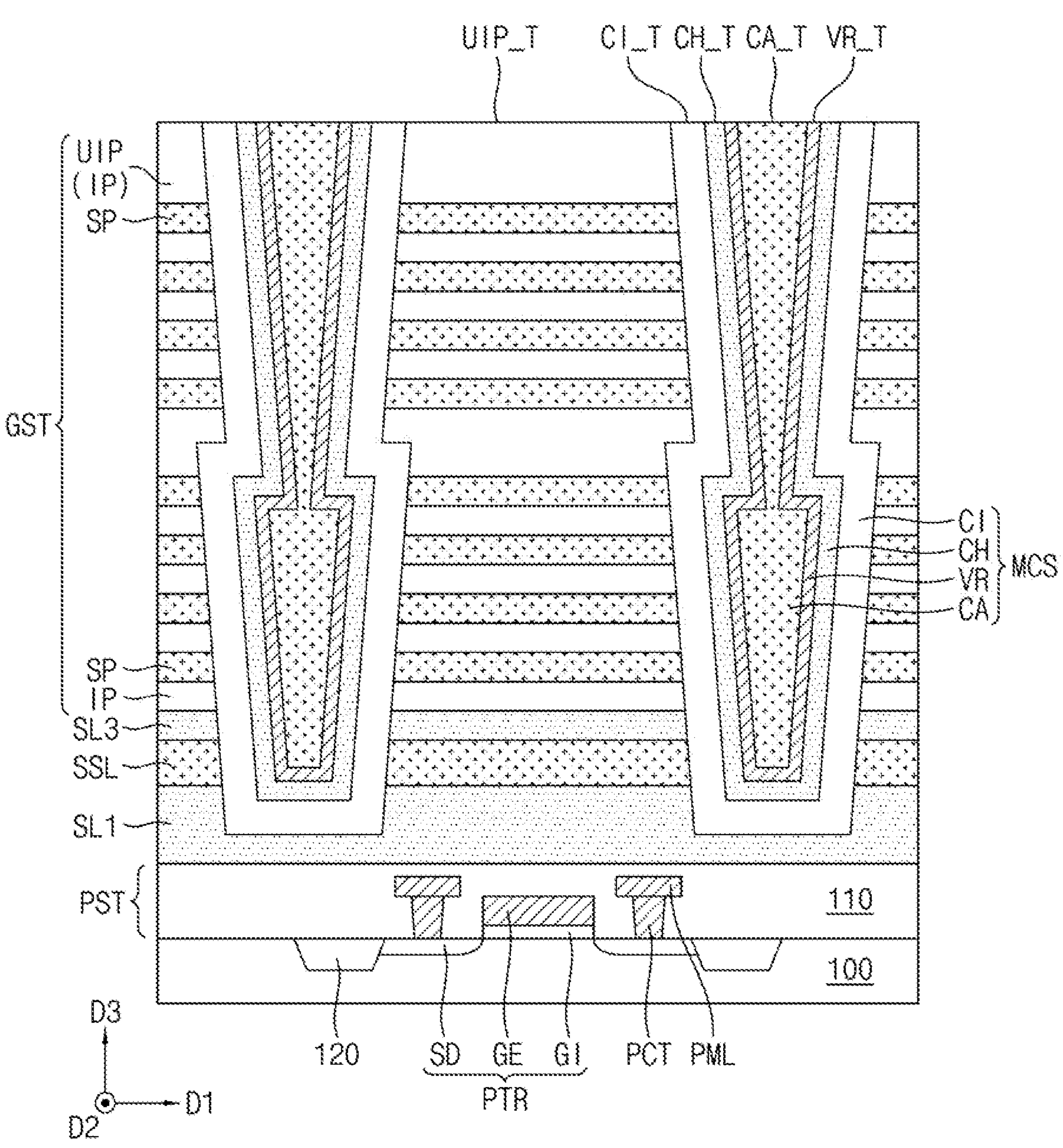

Referring to FIG. 6C, an upper portion of the memory channel material layer MCL and the mask layer MA may be removed. In an implementation, an upper portion of the channel insulating material layer CIL, an upper portion of the channel material layer CHL, an upper portion of the variable resistance material layer VRL, an upper portion of the capping material layer CAL, and the mask layer MA may be removed. In an implementation, the upper portion of the channel insulating material layer CIL, the upper portion of the channel material layer CHL, the upper portion of the variable resistance material layer VRL, the upper portion of the capping material layer CAL, and the mask layer MA may be removed by a chemical mechanical polishing (CMP) process.

As the upper portion of the memory channel material layer MCL is removed, memory channel structures MCS may be formed. The memory channel structures MCS may be surrounded by the insulating patterns IP and the sacrificial patterns SP of the gate stack structure GST.

The upper portion of the memory channel material layer MCL may be removed such that a top surface of the memory channel structure MCS and a top surface UIP_T of an uppermost insulating pattern UIP are coplanar. The upper portion of the channel insulating material layer CIL, the upper portion of the channel material layer CHL, the upper portion of the variable resistance material layer VRL, and the upper portion of the capping material layer CAL may be removed such that the a top surface CI_T of the channel insulating layer CI, a top surface CH_T of the channel layer CH, a top surface VR_T of the variable resistance layer VR, a top surface CA_T of the insulating capping layer CA, and the top surface UIP_T of the uppermost insulating pattern UIP are coplanar.

Figure 6D:
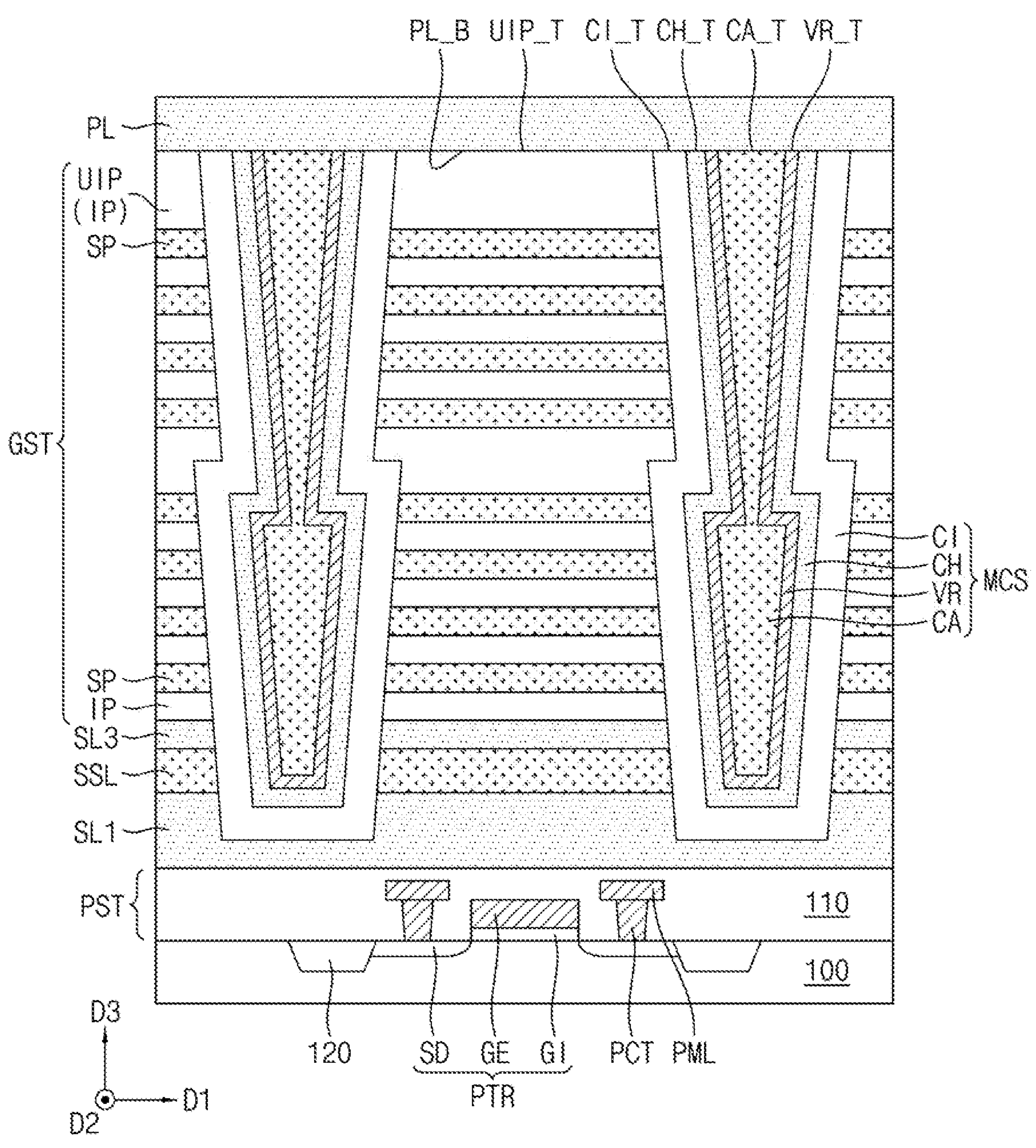

Referring to FIG. 6D, a pad material layer PL may be formed. The pad material layer PL may include a bottom surface PL_B extending linearly or planarly. The bottom surface PL_B of the pad material layer PL may contact the top surface of the memory channel structure MCS and the top surface UIP_T of the uppermost insulating pattern UP, which are coplanar. The pad material layer PL may be at a higher level than, e.g., on, the top surface of the memory channel structure MCS and a top surface of the gate stack structure GST.

The bottom surface PL_B of the pad material layer PL may contact (e.g., directly contact) the top surface CI_T of the channel insulating layer CI, the top surface CH_T of the channel layer CH, the top surface VR_T of the variable resistance layer VR, the top surface CA_T of the insulating capping layer CA and the top surface UIP_T of the uppermost insulating pattern UP, which are coplanar. The pad material layer PL may include a conductive material.

Figure 6E:
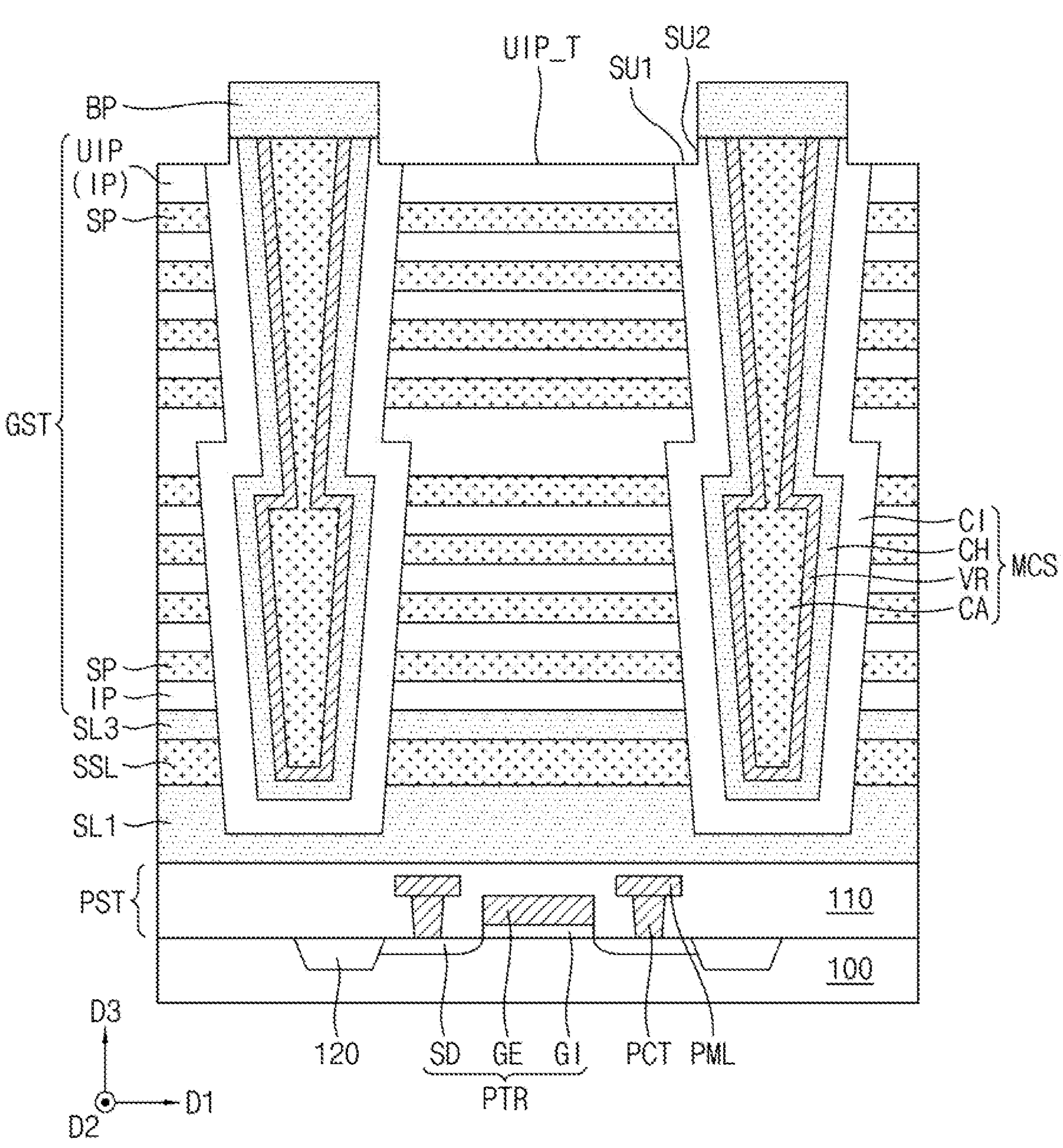

Referring to FIG. 6E, the pad material layer PL may be patterned, thereby forming bit line pads BP. In an implementation, patterning the pad material layer PL may include forming a mask pattern on the pad material layer PL, and etching the pad material layer PL using the mask pattern as an etch mask.

A portion of the channel insulating layer CI of the memory channel structure

MCS may be removed simultaneously with patterning of the pad material layer PL and, as such, the first surface SU1 and the second surface SU2 may be formed at the channel insulating layer CI of the memory channel structure MCS (e.g., such that the second surface SU2 of the channel insulating layer CI may be coplanar or aligned with the side wall of the bit line pad BP. An upper portion of the uppermost insulating pattern UIP of the gate stack structure GST may also be removed simultaneously with patterning of the pad material layer PL and, as such, the level of the upper surface UIP_T of the uppermost insulating pattern UIP of the gate stack structure GST may be lowered. Patterning the pad material layer PL, removing the portion of the channel insulating layer CI, and removing the upper portion of the uppermost insulating pattern UIP may be performed through a single process.

Figure 6F:
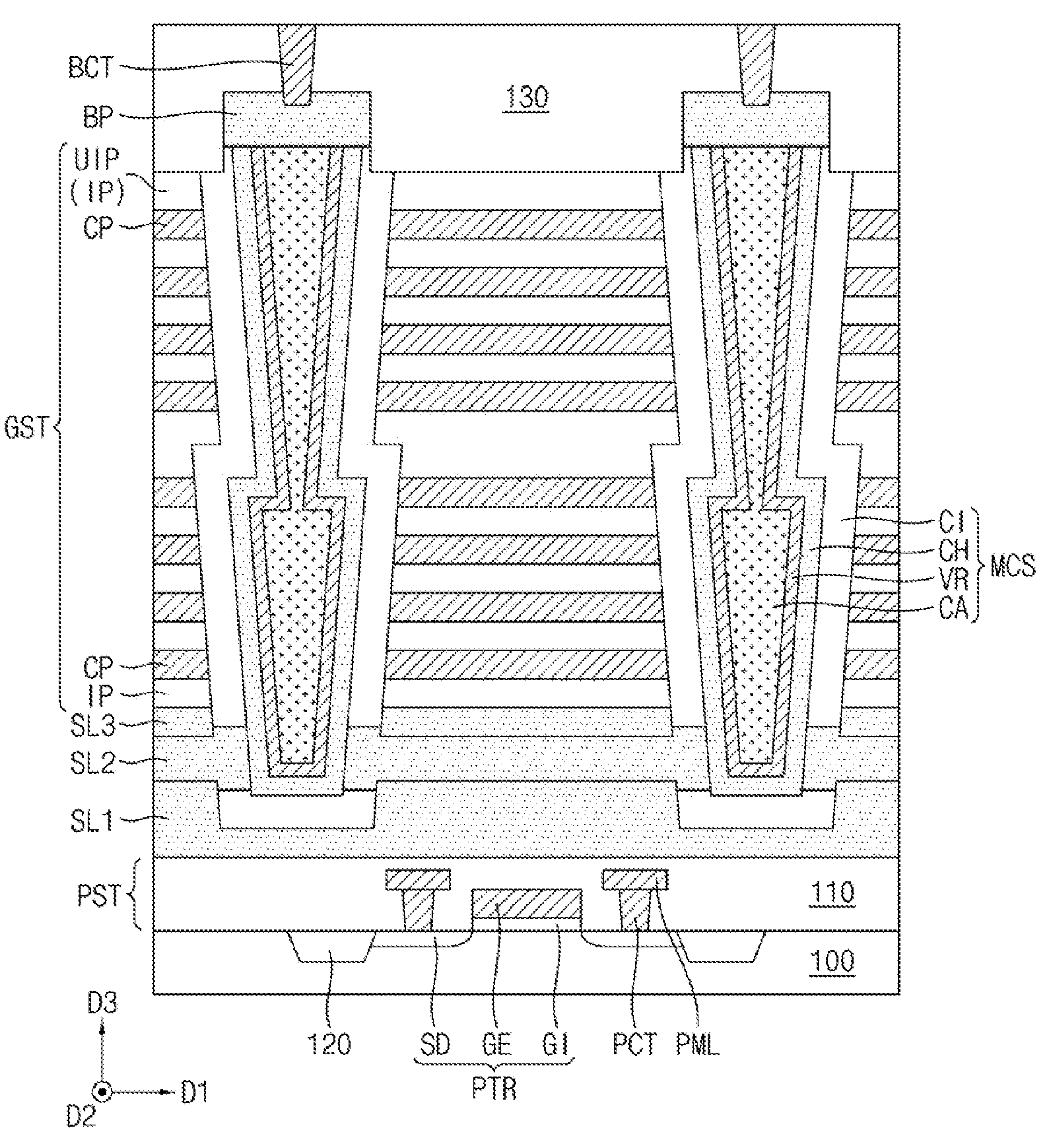

Referring to FIG. 6F, a cover insulating layer 130 covering the gate stack structure GST, the memory channel structures MCS, and the bit line pads BP may be formed. Subsequently, bit line contacts BCT extending through the cover insulating layer 130 may be formed.

A second source layer SL2 may be formed. Forming the second source layer SL2 may include removing the source sacrificial layer SSL, removing a portion of the channel insulating layer CI exposed in accordance with the removal of the source sacrificial layer SSL, and forming a second source layer SL2 connected to the channel layer CH exposed in accordance with the removal of the exposed portion of the channel insulating layer CI.

The sacrificial patterns SP may be substituted by or replaced with conductive patterns CP. Substituting the sacrificial patterns SP with the conductive patterns CP may include removing the sacrificial patterns SP, and forming the conductive patterns CP in empty spaces from which the sacrificial patterns SP have been removed.

Referring back to FIG. 5A, a bit line insulating layer 140 covering the cover insulating layer 130 and the bit line contacts BCT may be formed. Thereafter, bit lines BL may be formed in the bit line insulating layer 140.

In the semiconductor device manufacturing method according to the exemplary embodiments of the disclosure, after formation of the channel insulating layer CI, the channel layer CH, the variable resistance layer VR, and the insulating capping layer CA, the pad material layer PL may be formed without additional etching of the insulating capping layer CA, and the bit line pads BP may then be formed. In an implementation, a process of additionally etching the insulating capping layer CA may be omitted, and it may be possible to prevent a phenomenon in which characteristics of the variable resistance layer VR exposed in the process of additionally etching the insulating capping layer CA are degraded.

Figure 7:
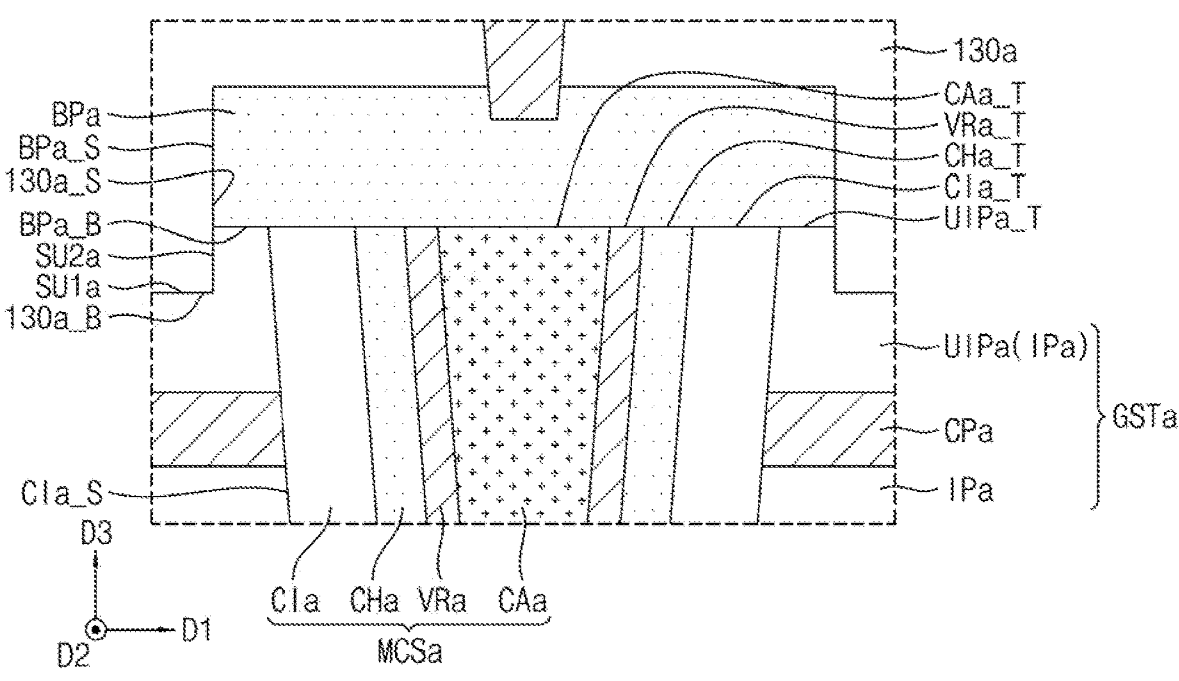
FIG. 7 is a cross-sectional view of a semiconductor device according to some exemplary embodiments of the disclosure.

FIG. 7 is a cross-sectional view of a semiconductor device according to some exemplary embodiments of the disclosure.

Referring to FIG. 7, a memory channel structure MCSa may include an insulating capping layer CAa, a variable resistance layer VRa, a channel layer CHa, and a channel insulating layer CIa. A gate stack structure GSTa may include insulating patterns IPa and conductive patterns CPa, and the insulating patterns IPa may include an uppermost insulating pattern UIPa.

A top surface CAa_T of the insulating capping layer CAa, a top surface VRa_T of the variable resistance layer VRa, a top surface CHa_T of the channel layer CHa, a top surface CIa_T of the channel insulating layer CIa, and a top surface UIPa_T of the uppermost insulating pattern UIPa may be coplanar. The top surface CAa_T of the insulating capping layer CAa, the top surface VRa_T of the variable resistance layer VRa, the top surface CHa_T of the channel layer CHa, the top surface CIa_T of the channel insulating layer CIa, and the top surface UIPa_T of the uppermost insulating pattern UIPa may contact (e.g., directly contact) a bottom surface BPa_B of a bit line pad BPa.

The uppermost insulating pattern UIPa may include a first surface SU1_a_ and SU2_a_. The second surface SU2_a_ of the uppermost insulating pattern UIPa may be coplanar or continuous with a side wall BPa_S of the bit line pad BPa. The second surface SU2_a_ of the uppermost insulating pattern UIPa may contact a side wall 130_a__S of a cover insulating layer 130_a_. The second surface SU2_a_ of the uppermost insulating pattern UIPa may be connected to the top surface UIPa_T of the uppermost insulating pattern UIPa. The first surface SU1_a_ of the uppermost insulating pattern UIPa may contact a bottom surface 130_a__B of the cover insulating layer 130_a_. The first surface SU1_a_ of the uppermost insulating pattern UIPa may be connected to the second surface SU2_a_ of the uppermost insulating pattern UIPa. The first surface SU1_a_ and the second surface SU2_a_ of the uppermost insulating pattern UIPa may be interconnected while intersecting each other. The level of the first surface SU1_a_ of the uppermost insulating pattern UIPa may be lower than the level of the top surface UIPa_T of the upper most insulating pattern UIPa.

A side wall CIa_S and a top surface CIa_T of the channel insulating layer CIa may be interconnected. The channel insulating layer CIa of the memory channel structure MCSa may be spaced apart from the cover insulating layer 130_a_. The bit line pad BPa may have a greater maximum width than a maximum width of the memory channel structure MCSa.

Figure 8:
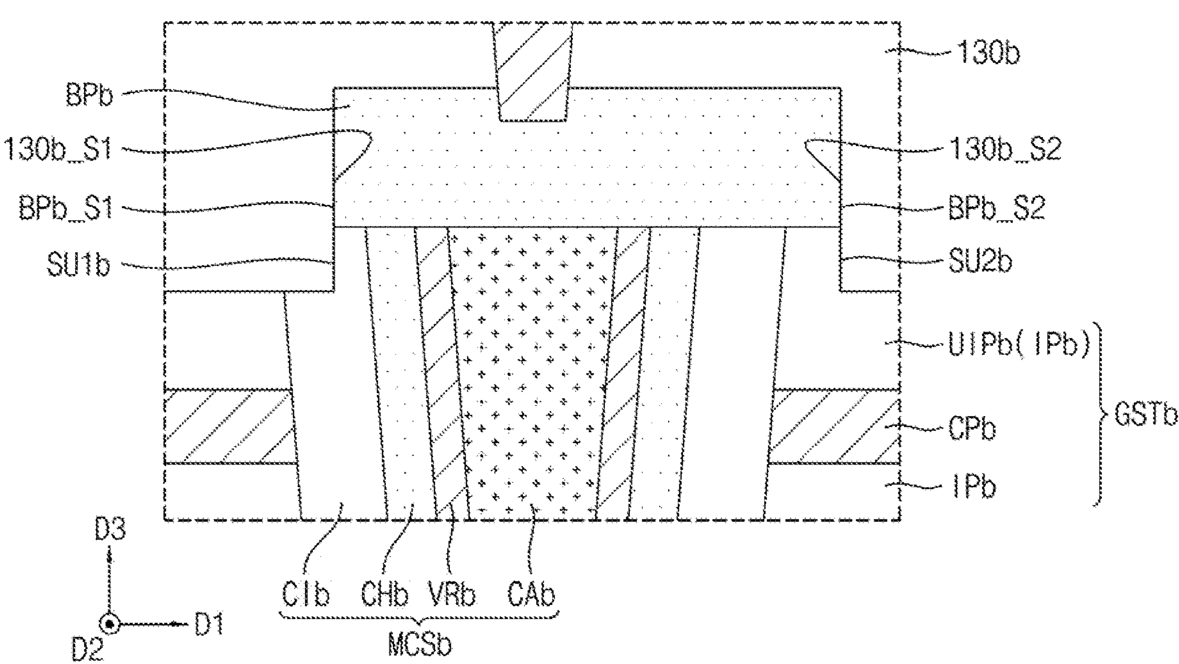
FIG. 8 is a cross-sectional view of a semiconductor device according to some exemplary embodiments of the disclosure.

FIG. 8 is a cross-sectional view of a semiconductor device according to some exemplary embodiments of the disclosure.

Referring to FIG. 8, a memory channel structure MCSb may include an insulating capping layer CAb, a variable resistance layer VRb, a channel layer CHb, and a channel insulating layer CIb. A gate stack structure GSTb may include insulating patterns IPb and conductive patterns CPb, and the insulating patterns IPb may include an uppermost insulating pattern UIPb.

A bit line pad BPb may include a first side wall BPb_S1 and a second side wall BPb_S2 opposing each other. The first side wall BPb_S1 of the bit line pad BPb may be coplanar with a surface SU1_b_ of the channel insulating layer CIb. The second side wall BPb_S2 of the bit line pad BPb may be coplanar or continuous with a surface SU2_b_ of the uppermost insulating pattern UIPb. The first side wall BPb_S1 of the bit line pad BPb and the surface SU1_b_ of the channel insulating layer CIb may contact a first side wall 130_b__S1 of a cover insulating layer 130_b_. The second side wall BPb_S2 of the bit line pad BPb and the surface SU2_b_ of the uppermost insulating pattern UIPb may contact a second side wall 130_b__S2 of the cover insulating layer 130_b_. The first and second side walls 130_b__S1 and 130_b__2 of the cover insulating layer 130_b_ may face each other.

Figure 9:
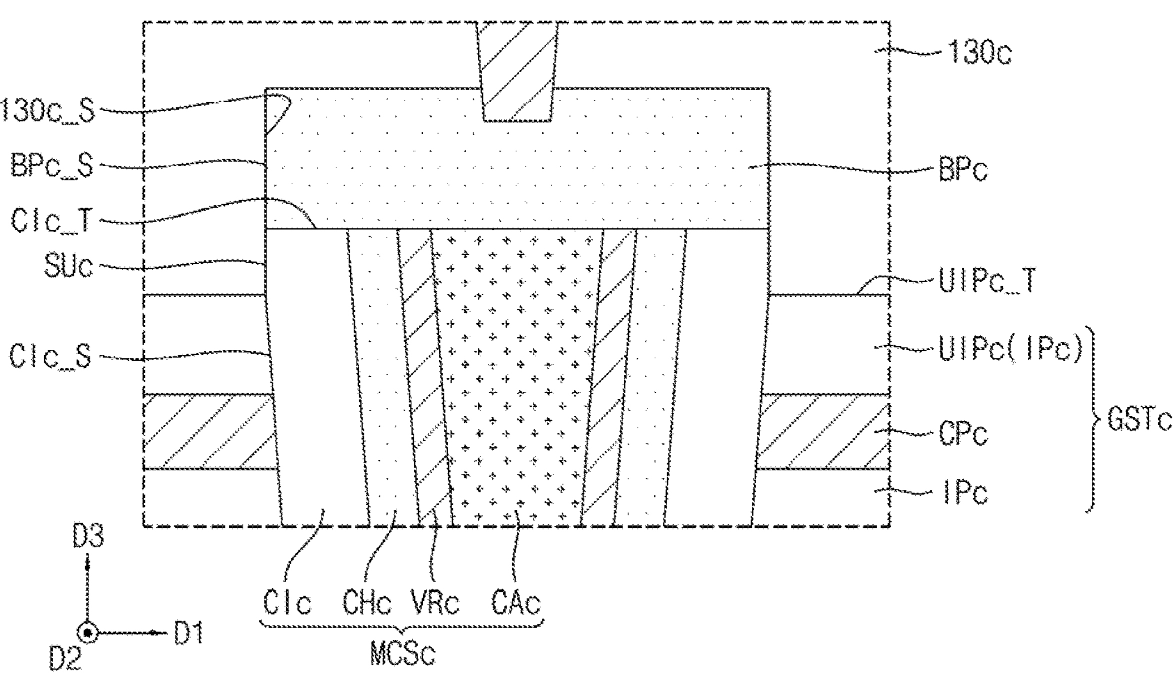
FIG. 9 is a cross-sectional view of a semiconductor device according to some exemplary embodiments of the disclosure.

FIG. 9 is a cross-sectional view of a semiconductor device according to some exemplary embodiments of the disclosure.

Referring to FIG. 9, a memory channel structure MCSc may include an insulating capping layer CAc, a variable resistance layer VRc, a channel layer CHc, and a channel insulating layer CIc. A gate stack structure GSTc may include insulating patterns IPc and conductive patterns CPc, and the insulating patterns IPc may include an uppermost insulating pattern UIPc.

The channel insulating layer CIc may include a surface SUc interconnecting a top surface CIc_T thereof and a side wall CIc_S thereof. The surface SUc of the channel insulating layer CIc may be coplanar or continuous with a side wall BPc_S of a bit line pad BPc. The surface SUc of the channel insulating layer CIc may contact a side wall 130_c__S of a cover insulating layer 130_c_. The surface SUc of the channel insulating layer CLc may contact a top surface UIPc_T of the uppermost insulating pattern UIPc.

By way of summation and review, in one method for increasing the data storage capacity of a semiconductor device, a semiconductor device may include three-dimensionally arranged memory cells in place of two-dimensionally arranged memory cells.

One or more embodiments may provide a method for manufacturing a semiconductor device, which is capable of preventing a phenomenon in which characteristics of a variable resistance layer are degraded.

In accordance with the semiconductor device manufacturing method according to the exemplary embodiments of the disclosure, a pad material layer may be formed, and may then be patterned, thereby forming a bit line pad and, as such, it may be possible to prevent a phenomenon in which characteristics of a variable resistance layer are degraded.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:

a gate stack structure including alternately stacked insulating patterns and conductive patterns;

a memory channel structure extending through the gate stack structure; and a bit line pad on the memory channel structure, wherein:

the memory channel structure includes a variable resistance layer, a channel layer surrounding the variable resistance layer, and a channel insulating layer surrounding the channel layer, and a bottom surface of the bit line pad contacts a top surface of the variable resistance layer, a top surface of the channel layer, and a top surface of the channel insulating layer, wherein:

the channel insulating layer has a side wall contacting the conductive patterns and the insulating patterns, and an L-shaped surface interconnecting the side wall and the top surface of the channel insulating layer, and a portion of the L-shaped surface is coplanar with a side wall of the bit line pad.

2. The semiconductor device as claimed in claim 1, wherein the variable resistance layer includes a transition metal oxide.

3. The semiconductor device as claimed in claim 2, wherein the variable resistance layer includes zirconium oxide, hafnium oxide, aluminum oxide, nickel oxide, copper oxide, molybdenum oxide, tantalum oxide, titanium oxide, or tungsten oxide.

4. The semiconductor device as claimed in claim 1, wherein a maximum width of the bit line pad is smaller than a maximum width of the memory channel structure.

5. A semiconductor device, comprising:

a gate stack structure including alternately stacked insulating patterns and conductive patterns;

a memory channel structure extending through the gate stack structure; and a bit line pad on the memory channel structure, wherein:

the memory channel structure includes a variable resistance layer, a channel layer surrounding the variable resistance layer, and a channel insulating layer surrounding the channel layer, the insulating patterns include an uppermost insulating pattern at an uppermost portion of the gate stack structure, and the channel insulating layer has:

a first surface coplanar with a top surface of the uppermost insulating pattern, and a second surface coplanar with a side wall of the bit line pad, the second surface facing away from the channel layer.

6. The semiconductor device as claimed in claim 5, wherein the first surface and the second surface of the channel insulating layer interconnect a top surface and a side wall of the channel insulating layer.

7. The semiconductor device as claimed in claim 6, wherein the first surface and the second surface of the channel insulating layer are interconnected and intersect each other.

8. The semiconductor device as claimed in claim 5, wherein a level of a top surface of the variable resistance layer, a level of a top surface of the channel layer, and a level of a top surface of the channel insulating layer are each higher than a level of the top surface of the uppermost insulating pattern.

9. The semiconductor device as claimed in claim 5, wherein: the memory channel structure further includes an insulating capping layer inside the variable resistance layer; and a top surface of the variable resistance layer, a top surface of the channel layer, a top surface of the channel insulating layer, and a top surface of the insulating capping layer are coplanar.

10. The semiconductor device as claimed in claim 9, wherein the insulating capping layer includes a material that is not chemically bondable to a material included in the variable resistance layer.

11. The semiconductor device as claimed in claim 10, wherein the insulating capping layer includes silicon nitride.

12. An electronic system, comprising:

a main substrate;

a semiconductor device on the main substrate; and a controller electrically connected to the semiconductor device on the main substrate, wherein:

the semiconductor device includes:

a gate stack structure including alternately stacked insulating patterns and conductive patterns;

a memory channel structure extending through the gate stack structure; and a bit line pad on the memory channel structure, the memory channel structure includes a variable resistance layer, a channel layer surrounding the variable resistance layer, and a channel insulating layer surrounding the channel layer, the insulating patterns include an uppermost insulating pattern at an uppermost portion of the gate stack structure, a level of a top surface of the variable resistance layer, a level of a top surface of the channel layer, and a level of a top surface of the channel insulating layer are each higher than a level of a top surface of the uppermost insulating pattern, and the top surfaces of the variable resistance layer, the channel layer, and the channel insulating layer are coplanar.

13. The electronic system as claimed in claim 12, wherein: the semiconductor device further includes a cover insulating layer covering the gate stack structure, the memory channel structure, and the bit line pad; and a level of a bottom surface of the cover insulating layer is lower than the level of the top surface of the variable resistance layer, is lower than the level of the top surface of the channel layer, and is lower than the level of the top surface of the channel insulating layer.

14. The electronic system as claimed in claim 13, wherein the channel insulating layer has a surface contacting a side wall of the cover insulating layer.

15. The electronic system as claimed in claim 14, wherein the surface of the channel insulating layer is coplanar with a side wall of the bit line pad.

16. The electronic system as claimed in claim 14, wherein the surface of the channel insulating layer interconnects a side wall and the top surface of the channel insulating layer.

17. The electronic system as claimed in claim 13, wherein the memory channel structure is spaced apart from the cover insulating layer.

18. The electronic system of claim 13, wherein the cover insulating layer covers and contacts at least a portion of a top surface of the bit line pad.

19. The electronic system of claim 12, wherein the memory channel structure further includes an insulating capping layer inside the variable resistance layer.

20. The electronic system of claim 12, wherein the bit line pad contacts the variable resistance layer, the channel layer, and the channel insulating layer.

* * * * *